United States Patent
Iotov et al.

(10) Patent No.: US 7,159,204 B2
(45) Date of Patent: Jan. 2, 2007

(54) SYSTEM AND METHOD FOR DESIGN ENTRY AND SYNTHESIS IN PROGRAMMABLE LOGIC DEVICES

(75) Inventors: Mihail Iotov, San Jose, CA (US); Greg Starr, San Jose, CA (US)

(73) Assignee: Altera Corporation, San Jose, CA (US)

( * ) Notice: Subject to any disclaimer, the term of this patent is extended or adjusted under 35 U.S.C. 154(b) by 216 days.

(21) Appl. No.: 10/353,816

(22) Filed: Jan. 28, 2003

(65) Prior Publication Data

US 2005/0088867 A1    Apr. 28, 2005

(51) Int. Cl.
  *G06F 17/50* (2006.01)
  *H03K 19/00* (2006.01)
(52) U.S. Cl. .............................. 716/16; 716/17; 716/18
(58) Field of Classification Search ............. 716/16–18
  See application file for complete search history.

(56) References Cited

U.S. PATENT DOCUMENTS

| | | | |
|---|---|---|---|
| 6,272,669 B1 * | 8/2001 | Anderson et al. ............. 716/16 |
| 6,675,306 B1 * | 1/2004 | Baxter ........................ 713/400 |
| 6,747,478 B1 * | 6/2004 | Madurawe ..................... 326/39 |
| 2002/0108094 A1 * | 8/2002 | Scurry ............................ 716/5 |
| 2003/0229877 A1 * | 12/2003 | Bersch et al. ................. 716/16 |
| 2004/0183708 A1 * | 9/2004 | Nazarian .................... 341/160 |

* cited by examiner

*Primary Examiner*—Vuthe Siek
*Assistant Examiner*—Magid Y. Dimyan
(74) *Attorney, Agent, or Firm*—Townsend and Townsend and Crew LLP

(57) ABSTRACT

A system and method facilitates the implementation of analog circuitry in electronic programmable devices. A user can specify user measurable parameters for analog features of the circuit, without requiring knowledge of the internal way in which those analog circuit are implemented in the programmable device to achieve desired properties of the analog parameters of interest. The implementation can be performed in different devices which may implement the analog circuit in vastly different ways.

40 Claims, 9 Drawing Sheets

FIG. 5A

SYSTEM AND METHOD FOR DESIGN ENTRY AND SYNTHESIS IN PROGRAMMABLE LOGIC DEVICES

BACKGROUND OF THE INVENTION

The present invention relates generally to integrated circuits and more specifically to programming integrated circuits having programmable logic and programmable analog elements.

Design engineers, faced with the challenge of designing increasingly high performance systems, often turn to programmable logic devices (PLDs) which combine logic and analog elements on the same chip. Conventional design systems for PLDs enhanced with programmable analog elements can provide support for analog circuits commonly used in conjunction with logic. For example, a user can easily configure a simple PLL or DLL circuit to achieve a desired division or multiplication, as it involves a relatively trivial computation.

However, as systems become more sophisticated, increasingly complex analog circuitry is required. The parameters for specifying these circuits are no longer a trivial matter in some cases. Consider a complex phase locked loop (PLL) analog circuit (e.g. one with two or more clock outputs and programmable loop elements). One cannot simply enter a set of parameters specifying the reconfigurable hardware elements to implement a PLL in a programmable device and expect suitable (e.g., stable) operation of the circuit. A number of stability relationships typically need to be satisfied. For example, in the Stratix PLLs, the shape of the transfer curve in frequency space must have a particular form. Special attention must be given to the 'zero', 'pole', and bandwidth values, which need to satisfy certain conditions, such as:

$F_{zero}=1/(2*Pi*R*C)$; $Pi=3.14$
$F_{pole}=1/(2*Pi*R*C_h)$;
Bandwidth=$I*R*K_{vco}/(M*2*Pi)$; and
$F_{zero}<Bandwidth<F_{pole}$.

These conditions are difficult to achieve with manual selection of the M, R, S, C, and $C_h$ values.

It can be appreciated therefore, that manual computation of the reconfigurable hardware elements to attain a desired circuit behavior is a very difficult (if not impossible) and a highly time intensive task, absent a detailed knowledge of circuit theory and access to an implementation of the computational algorithms. Typically, the designer knows what she wants from an analog circuit in terms of its high level, observable behavior; e.g., a certain frequency response. However, a properly configured programmable device which implements the desired analog circuit oftentimes requires a greater understanding in circuit theory than may be possessed by a system-level designer.

There is a desire to facilitate the design process of programmable devices which incorporate programmable logic and programmable analog elements. There is a need to allow designers to specify analog circuit behavior in a programmable device without requiring the intimate knowledge of circuit theory that may be needed to attain a workable implementation.

SUMMARY OF THE INVENTION

An aspect of the invention provides HDL design entry of analog properties of an analog circuit rather than conventional hardware properties of the programmable analog elements used to implement the analog circuit. In accordance with embodiments of the invention, a user interface and synthesis algorithm are provided for specifying analog features of an analog circuit to facilitate programming programmable logic and programmable analog elements comprising an electronic device. A computation engine computes appropriate hardware settings for the programmable hardware elements to meet user requirements, subject to hardware constraints imposed by the particular device.

According to the invention, the programmable device can be a programmable logic device comprising programmable logic and programmable analog elements. More generally, the programmable device can be any electronic device having programmable logic and programmable analog elements.

The present invention allows the user to specify properties for analog circuits without any knowledge of the internal implementation details by which such circuits might be implemented in a particular programmable device. In fact, among different programmable devices the implementation can be vastly different for each device and the user would not know it.

BRIEF DESCRIPTION OF THE DRAWINGS

The present invention can be understood with reference to the following description and the accompanying figures, where:

FIGS. 5A–5C illustrate graphical user interface exemplars for interacting with a user to obtain design information in accordance with an aspect of the present invention;

DETAILED DESCRIPTION

Certain terms are defined herein for the purposes of the following discussion, since their ordinary meanings tend to vary in the literature. The phrase "analog parameter" refers to an observable characteristic of an analog circuit (e.g., frequency response measured in terms of its bandwidth). The phrase "analog properties" refers to the user-desired observable quantities that characterize a circuit (e.g., bandwidth, lock-time, etc.). The phrase "programmable analog elements" refers to the basic hardware devices, some parameters of which can be programmed, e.g. capacitance, resistance, charge pump current, and so on. The phrase "hardware parameter" refers to a programmable aspect of the programmable analog elements that can be set; e.g. suppose the programmable analog element is a resistor, a programmable aspect of the resistor would be its resistance. The phrase "hardware property" refers to a value (setting) applied to a programmable analog element; e.g. the resistance value.

Figure 1:
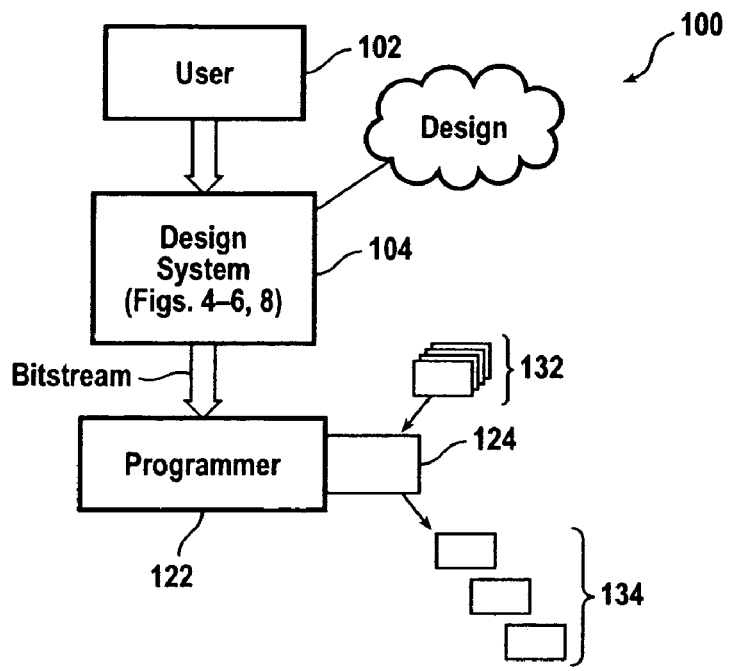
FIG. 1 shows a high level generalized system block diagram of an illustrative embodiment of the present invention.

As can be seen in the system exemplar of FIG. 1, an illustrative embodiment of a design system 100 for programmable logic in accordance with the present invention includes a design system component 104 as the principal component. The design system component receives directives from a user 102 resulting in a design to be implemented with programmable devices. For the discussion which follows, it can be appreciated that the term "programmable device" encompasses a wide variety of implementations, including but not limited to conventionally known devices such as PLD's (programmable logic devices), FPGA's (field programmable gate arrays), and the like. Programmable devices, however, can also refer to ASIC's (application specific integrated circuits) which feature some degree of programmability by incorporating various programmable elements. More generally, "programmable devices" will be understood to mean any electronic device having some degree of programmability by having incorporated therein programmable elements. Furthermore, it will be understood that in the context of the present invention, "programmable elements" includes programmable logic elements and programmable analog elements.

Continuing with FIG. 1, it can be appreciated that the "user" 102 can be a conventional human user. However, a "user" can be any source of information from which a design can result, such as a machine that is appropriately interfaced to the design system 100.

The design is conventionally specified in HDL (hardware definition language), which is a common specification language that predominates in this technical field. However, it is noted that a specification language paradigm (such as HDL) is not required to practice the invention. It can be appreciated that alternate hardware specification methodologies can be adapted to the present invention.

The design system component 104 can produce a bitstream which specifies the logic and analog elements in a programmable device to implement the desired design. The bitstream is generated from the HDL specification by a process known as "compiling" which is a very well known and understood operation. The bitstream is then provided to a programmer 122. As shown in FIG. 1, a suitable interface can be provided between the design system component 104 and the programmer to facilitate the transfer of information representative of the bitstream from the design system component to the programmer. The device programmer is a conventionally known apparatus used to program programmable devices 132 in accordance with the bitstream to produce programmed devices 134 that implement the design.

Figure 2:
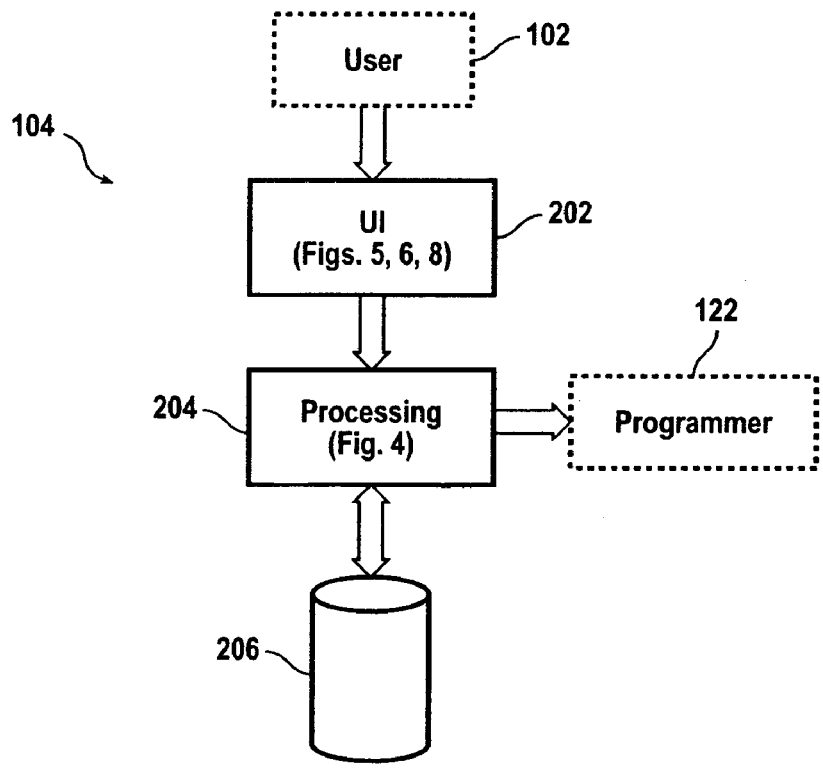
FIG. 2 shows a generalized block diagram of the design system component shown in FIG. 1.

FIG. 2 shows a highly generalized system block diagram of the design component 104 shown in FIG. 1. Typically, there is a processing component 204 which can provide various functions to facilitate the design process. The processing component can be any common computing system architecture, for example a PC (personal computer) or a workstation configured with appropriate input and output devices, and operating under an OS (operating system) such as Unix.

Typical phases of the design process include identifying system requirements for the programmable device, defining the system architecture, designing the logic which constitutes a high level design of the system, and implementation of the design. In the present invention the design includes analog circuitry in addition to conventional logic. For example, a commonly employed analog circuit is a phase-locked loop (PLL). For convenience, the remainder of the discussion will be based on the PLL as the analog design element and its analog properties. However, it can be appreciated that other programmable analog elements suitable for incorporation with programmable logic can be readily provided in accordance with the invention. The various aspects of the invention described in connection with PLL's can be readily extended and/or adapted for programmable analog elements which can be used to implement analog circuits other than PLL's.

Continuing with FIG. 2, an appropriate user interface (UI) 202 can be provided to access the processing component 204. Typical UI's include the familiar graphical user interface (GUI). However, a command line interface (CLI) can be provided. A CLI interface may be appropriate if the design is produced elsewhere, and the design system 100 is simply configured to serve as a compiler to produce the bitstream. The UI can be a machine interface, which might be appropriate in a configuration where the design system is incorporated in a larger design processing system. For example, a DSP builder system may use the same computational engine (408, FIG. 4) and interface with the processing component 204 via a suitable machine interface. It can be appreciated that the UI can manifest itself in any of a number of forms, depending on the circumstances or requirements of the operating environment.

A data storage component 206 can be provided to store a variety of information. For example, the data store can be used to store a generated bitstream for later downloading to the device programmer 122.

The foregoing components can be arranged in any of a number of configurations. A conventional arrangement is a standalone configuration in which all the components are provided in a single system such as the one shown in FIG. 2. In such a configuration, the processing component can be a workstation running an appropriate operating system. Appropriate software can be included to provide the various functions for performing the operations in accordance with the invention; e.g., the chart in FIG. 4 discussed below illustrates aspects of the present invention.

Figure 3A:
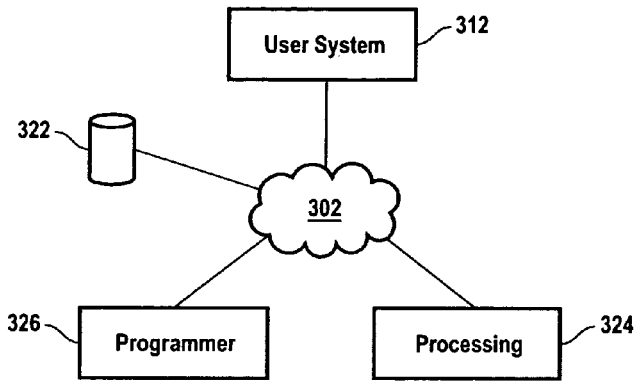
FIGS. 3A and 3B illustrate exemplars of typical networked configurations of the embodiment shown in FIG. 1.

FIG. 3A generically represents various configurations of the system shown in FIG. 1. For example, the user system 312 might comprise the components shown in FIGS. 1 and 2, absent the data store 206 (FIG. 2). In such a configuration, a remote data store 322 can be provided. An appropriate communication network 302 can be provided to facilitate communication between the user system and the remote data store. This configuration might be appropriate in a large enterprise, where users have diskless workstations.

FIG. 3A also represents a configuration in which the user system 312 comprises the components shown in FIGS. 1 and 2, except that some or all of the processing is provided remotely by the remote processing component 324, thus obviating the processing component 204 (FIG. 2). This may be suitable in an architecture, for example, where a single high-end, expensive, computer is shared among many users. In still another configuration, the device programmer 122 (FIG. 1) is separated from the user system 312, and replaced by a remote device programmer 326.

Figure 3B:
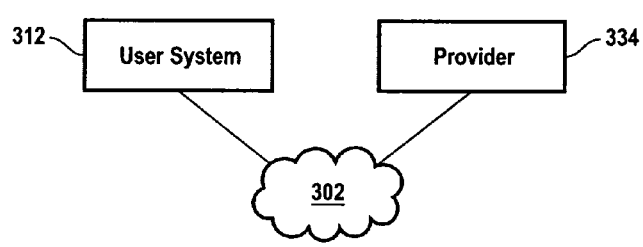

FIG. 3B shows a configuration where the processing aspects of the present invention can be provided remotely. Thus, a business model might include a provider 334 who provides access to certain processing functions over the Internet. In another business model, the provider might supply upgrades to the user system 312. Thus, one can appreciate from the foregoing examples that a variety of distributed processing configurations can be readily attained by those of ordinary skill in the relevant arts.

In accordance with the invention, a user is allowed to specify the analog properties of an analog circuit which can be implemented in electronic devices ("programmable devices") having programmable logic elements and programmable analog elements. As noted above, the remaining discussion will use phase-locked loop (PLL) circuits as an example of an analog circuit as a matter of convenience, it being understood that the invention is not limited to a PLL as the only analog circuit.

The user can specify user measurable properties for advanced (analog) features, without any knowledge of the internal way in which those features are implemented in the PLL. In fact, for a different programmable device which provides different programmable analog elements, the analog circuit might be implemented in a vastly different way.

Figure 4:
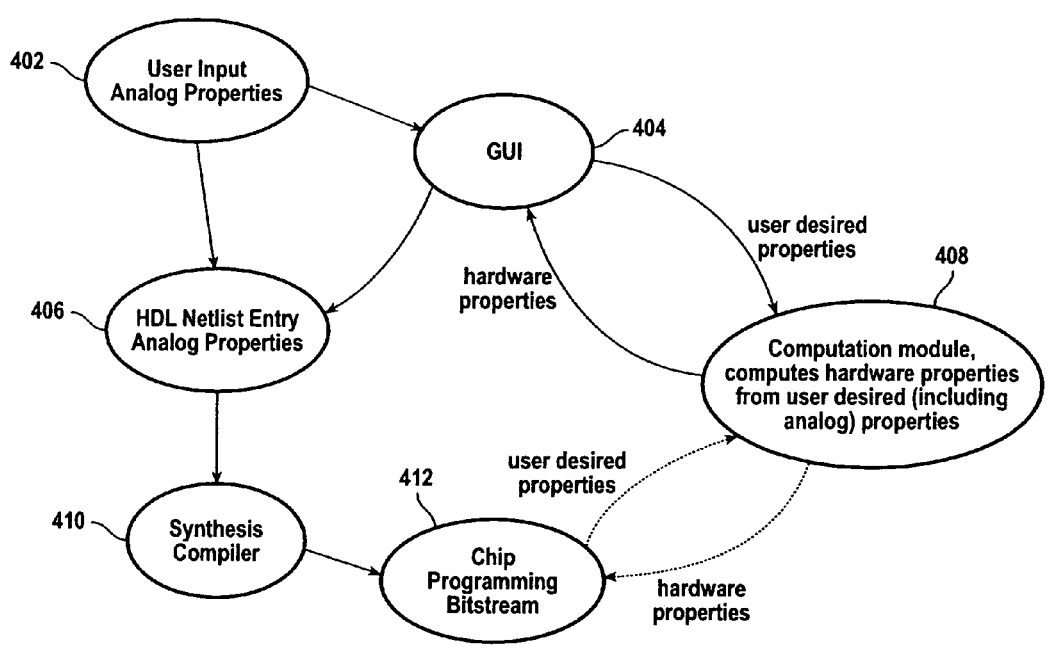
FIG. 4 shows the high level functional components of a design system in accordance with the invention.

FIG. 4 is a high level illustration of the functional units and relevant data components comprising a design system according to the present invention. The functional units represent actions performed on data by a user or a computing system. Accordingly, in the case of a computing system, the functional units can be computer program code or the like to perform the indicated function.

A user input functional unit 402 represents a source of data for a design. For example, the input can be an identifier that specifies a file containing the design. In the case of a human user, the input can be a file specifier. Alternatively, the input can be the design itself, the design being provided by the user via a user interface functional unit 404. The figure shows a GUI (graphical user interface) as an example of a user interface functional unit. Typically, a GUI-type interface is an appropriate user interface for specifying a design from scratch, or to modify an existing design. It can be appreciated of course that a simple command line interface may suffice for certain applications, wherein the user is provided with a set of commands that she types. It can be further appreciated that the user input can be a machine-to-machine interface. This might be appropriate in a configuration which places the user interface on one machine while the data processing components are on another machine(s) accessed over a suitable communication channel and communicating via a suitable communication protocol(s). FIGS. 3A and 3B show examples of possible configurations.

A netlist specification 406 is the data component that can result from the interaction between the user input functional unit 402 and the user interface functional unit 404. Alternatively, the user can provide the design specification directly to the system, as indicated by the flow from the user input functional unit 402 directly to the netlist specification 406. For example, a predefined HDL (netlist) specification may be read from a floppy disk, or some such storage medium, or it can be provided over a communication network, such as a LAN, WAN, or even the Internet As will be explained below, the netlist specification can include information representative of user-specified analog properties that characterize an analog circuit.

The user interface-functional unit 404 can communicate with a computational unit 408. As will be discussed in more detail, the computational unit generates information representative of hardware properties (values, settings) for a specific implementation of the programmable analog elements in the programmable device. This information can be processed by the GUI to provide a useful display to the user, thus allowing the user to modify the design or simply to verify a design. As will be discussed below, the GUI is a suitable interface for allowing the user to perform "what if" experiments with the design.

At some point, a decision will be made to proceed to the next phase of the design cycle, namely, to program a device. In the case of a user interacting with the user interface functionality 404, a directive can be issued to the GUI to generate the HDL specification 406. As noted above, the HDL specification can be provided directly from the user input functionality 402 as an alternate data path.

The HDL specification 406 is then provided to a synthesis functional unit 410. A conventional synthesis compiler receives an HDL specification and produces a data component known as a "bitstream." This bitstream specifies the "programming" of a programmable device to implement the design which is represented by the HDL specification. An embodiment in accordance with an aspect of the invention includes extending the HDL specification language definition to provide analog element primitives (language constructs) which represent user defined analog parameters that define the analog properties of the analog circuit. As mentioned above, the term "analog properties" refers to the user desired observable quantities that characterize a circuit (e.g. bandwidth, lock-time, etc.).

Providing additional HDL language elements allows a circuit designer to specify the characteristics of an analog circuit at a level of abstraction that is more familiar to the designer. Conventional HDL's such as Verilog®, VHDL, AHDL, and the like can be readily extended in accordance with the invention to permit a user to design analog circuits by specifying behavioral properties of the analog circuit.

The synthesis functional unit 410 provides conventional synthesis compiling functionality, along with the ability to compile the HDL language extensions. The synthesis functional unit can communicate with the computational functional unit 408 to obtain hardware properties of the programmable analog elements based on the analog properties of the analog circuit (e.g., PLL) as specified in the HDL specification. As defined above, the hardware properties are the settings of the programmable analog element that will implement the desired analog circuit.

In the case of a PLL analog circuit, settings associated with the programmable analog elements can include a charge pump current setting, a high frequency loop capacitor setting, a loop resistor setting, and a VCO gain setting. Based on the foregoing, it can be appreciated that other analog circuits will comprise corresponding programmable analog elements.

The result of the synthesis operation is a bitstream data component 412 which comprises bitstream patterns for programming the programmable logic elements in a programmable device and bitstream patterns (representative of settings) for programming the programmable analog elements contained in the programmable device. The programming results in an implementation of an analog circuit (e.g., a PLL) having the operating properties (characteristics) specified in the HDL specification.

An aspect of the invention is a method for design entry of analog properties. A more general embodiment of this aspect of the invention therefore is the user interface. The user interface functionality 404 represents a suitable user interface for requesting specific analog properties of an analog circuit. It is not relevant to the present invention how the user-specified analog properties are mapped to the hardware settings of the programmable analog elements. However, HDL is a widely used method for performing such a mapping to program a programmable device. Therefore, in a particular embodiment of the invention, the HDL language can be extended, as discussed above, to provide for this aspect of the invention.

To illustrate, consider our example analog circuit, the PLL. A commonly specified property (characteristic) of a PLL is the bandwidth parameter. A PLL's bandwidth is a measure of its ability to track the input clock and jitter. A high-bandwidth PLL can quickly lock onto a reference clock and thus can quickly react to any changes in the clock. However, the circuit becomes susceptible to jitter due to fluctuations in the clock. A low-bandwidth PLL, on the other hand, will take longer to lock, but will filter more jitter. Allowing a user to directly specify the bandwidth parameter offers great flexibility in compensating for jitter when an application requires cascading PLL's. Providing a configurable bandwidth parameter allows PLL designs be readily adapted in a wide variety of applications.

Another analog property associated with PLL's is the spread spectrum parameter. Spread spectrum is a method for reducing EMI (electromagnetic interference) by varying the clock frequency in a controlled manner. Varying the frequency reduces the total energy at any particular frequency because the clock does not run at any one frequency for a significant length of time. This results in a "smearing out" of the energy over a range of frequencies. A common numerical representation for specifying the spread spectrum parameter is the percent deviation of the frequency from its nominal value during normal operation. The spectral spreading of the clock signal is an approach to distribute the energy of the fundamental clock frequency to minimize peaking the energy at specific frequencies. The modulation width can be measured in up, down or center spread percentage. The "spread percentage" is typically defined as:

$(f_{max}-f_{min})/f_{max}$.

Modulation frequency is a property of PLLs, used in conjunction with the spread spectrum and which refers to the frequency at which the nominal frequency oscillates about the nominal value.

Duty cycle is a property of PLL's which refers to the ratio of the output high time to the total cycle time, expressed as a percentage.

Another parameter that describes a property of a PLL is the lock time. This parameter refers to the amount of time that is required by the PLL to attain the target frequency and phase after power-up, or after a programmed output frequency change.

Frequency overshoot is a parameter which specifies the maximum value, as a percentage of the operating frequency, above the nominal working frequency that the PLL will exhibit. For example, if the nominal frequency is $f_n$ and the PLL can reach a maximum value of $f_{max}$, then the overshoot parameter is $(f_{max}/f_n)-1$. Frequency overshoot can occur during a transient clock switchover event.

Attenuation factor is a parameter which indicates how much the PLL attenuates jitter on the reference clock. Basically, if the reference jitter is at a lower frequency than the PLL bandwidth, then the PLL will exactly track the reference jitter. If the frequency is greater than the PLL bandwidth, then the PLL will reject the jitter (attenuate it). The degree of attenuation is a function of the PLL architecture.

Figure 5A:
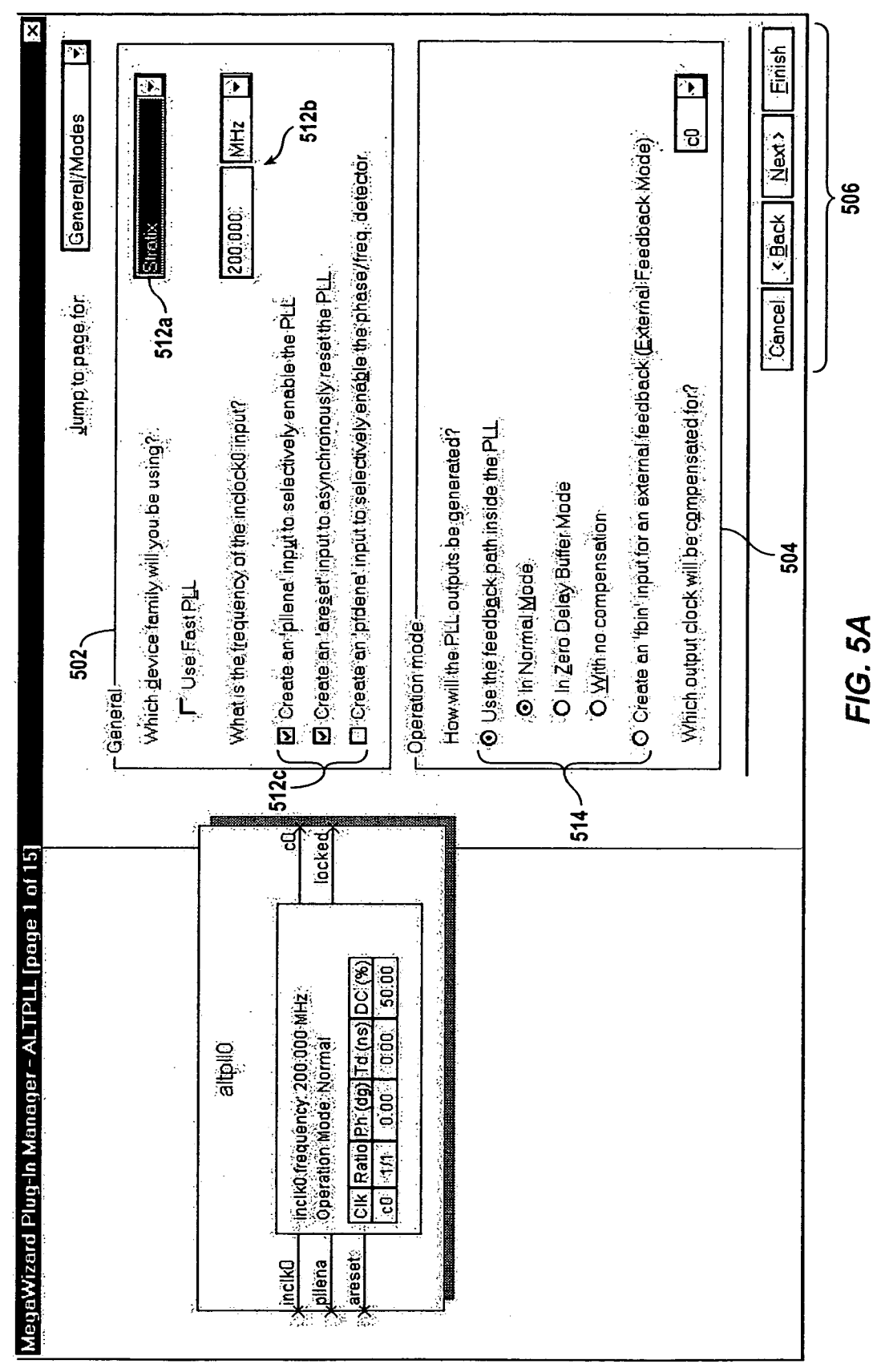
Figure 5B:
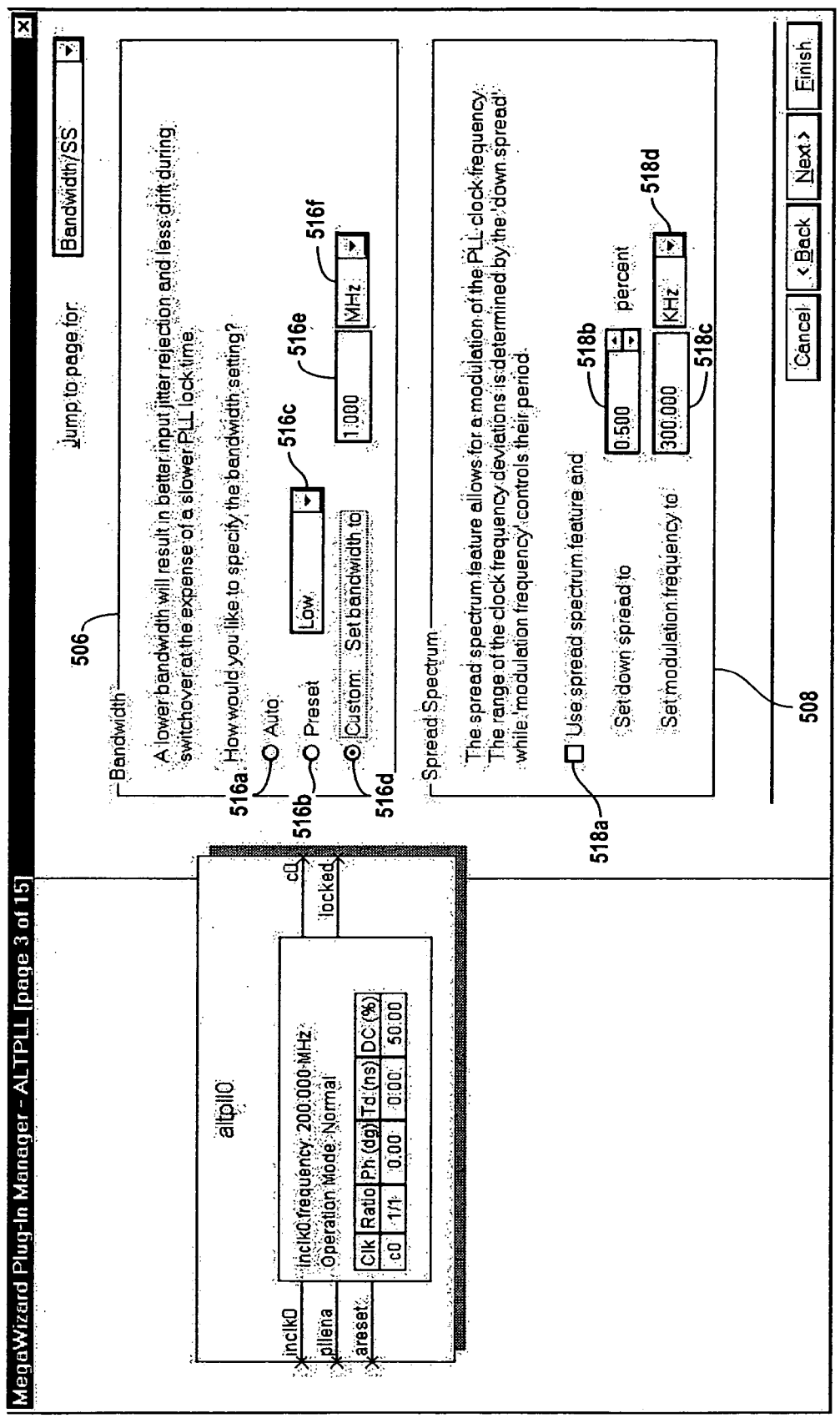
Figure 5C:
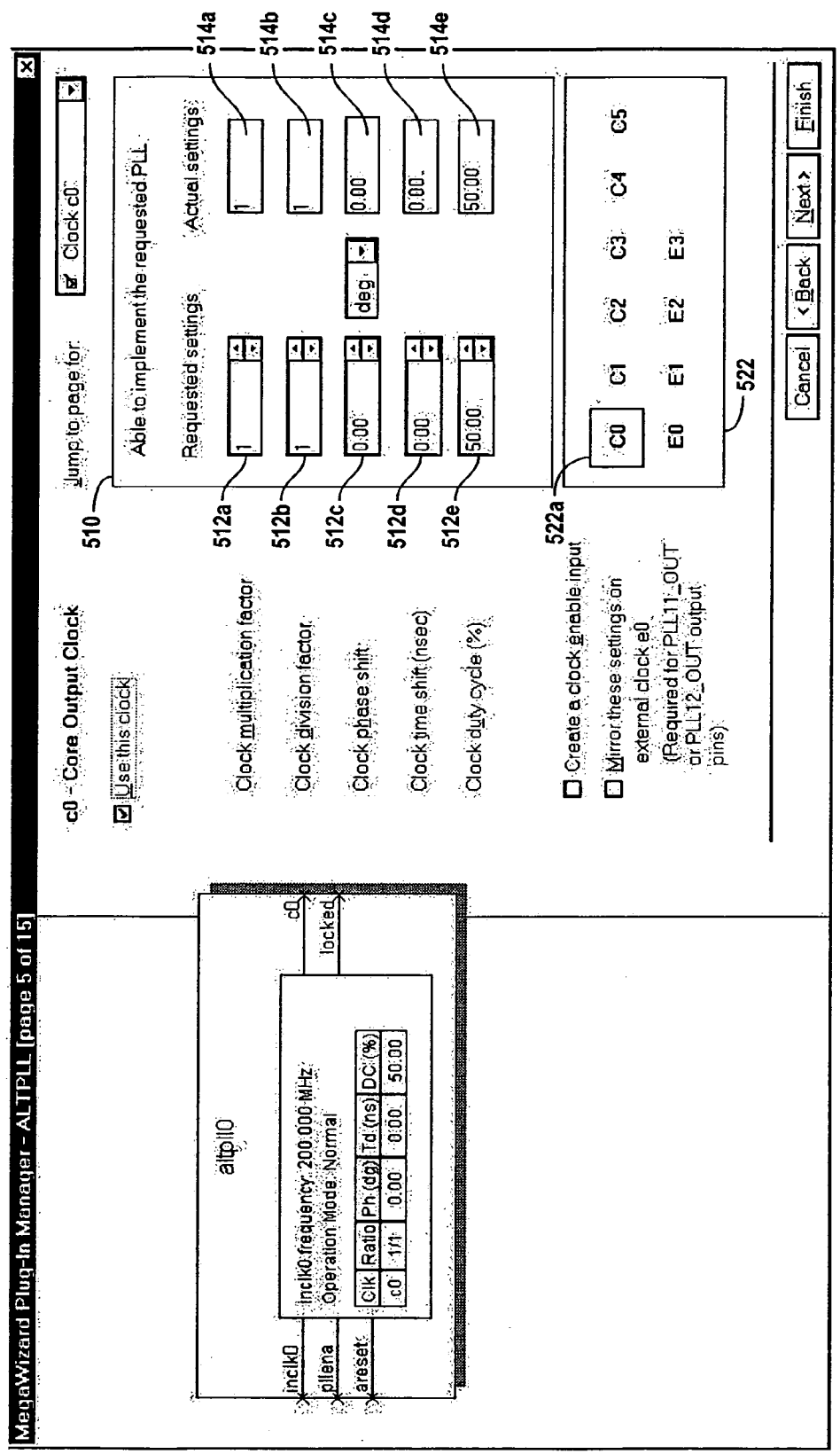

FIGS. 5A–5C are screenshots of an implementation of a GUI in accordance with the invention. The GUI can provide an interaction medium for a user during a design session to obtain design parameters which specify the properties of an analog circuit. The "look and feel" of the GUI is particular to the specific implementation. This illustrative GUI is presented here merely as an example and as a vehicle for explaining, in terms of a particular implementation, the broader aspects of the invention which will be readily apparent to those of ordinary skill in the relevant arts. The particular GUI shown in the figures are used with a programmable device known as the Stratix™ brand programmable device manufactured and sold by the Assignee of the present invention.

FIG. 5A shows an initial screenshot for obtaining general information about the design of the analog circuit, in this case a phase-locked loop (PLL). The information gathered by the interface illustrated in this screenshot is typical. For example, a graphic which presents a general information area 502 can be provided to allow the user to specify a particular device to be programmed. A pulldown menu graphic 512a can be provided to present a list of devices from which to choose. A data entry area 512b for specifying the input frequency to the PLL may comprise a data entry field for typing in a frequency and a pulldown menu to specify the frequency units, e.g., KHz, MHz, etc. IO pin definitions for the PLL can be specified. For example, a set of checkbox graphics 512c can be presented to the user, allowing her to pick which IO pins will be provided for the PLL.

A graphic which presents an operational mode area 504 can be presented. Radio button graphics can be presented to the user, allowing her to specify the mode by which the PLL outputs will be generated.

Conventional navigation buttons can be provided to facilitate the user's interaction. For example, button graphics 506 can permit a user to simply CANCEL this particular design session, to proceed to the NEXT step in the design session, to go BACK to a previous step, or to indicate that she has FINISHed the design.

FIG. 5B shows another screenshot illustrating how a user can specify parameters which define some properties of an analog circuit. In the case of a PLL, for example, a graphic which presents a bandwidth data entry area 506 can be provided. The user can specify the bandwidth via a number of modes. The user can specify the bandwidth in a qualitative manner. For example, the user can "click" on a radio button graphic 516a to specify the bandwidth "automatically." Clicking on this radio button signifies that the synthesis compiler functionality 410 will automatically determine an appropriate bandwidth parameter to satisfy the other PLL parameter settings. A second radio button 516b can be provided to allow the user to select the bandwidth using preset levels such as "High", "Medium", or "Low" quality levels. An associated pulldown menu 516c can be provided to display the preset choices, which can include additional levels, e.g., "Medium-High," "Medium-Low," "Very Low," and so on. Still a third radio button graphic 516d can be provided to allow the user specify a numeric value for bandwidth. Thus, a data entry field 516e can be provided, into which a numeric value is typed and a pulldown menu 516f can provide a selection of suitable units of frequency.

The spread spectrum frequency parameter can be set through a spread spectrum data entry area 508. A checkbox 518a allows the user to specify the spread spectrum parameters of a PLL. The figure shows the checkbox is unchecked, and so the corresponding data entry fields are grayed out. A first data entry field 518b is provided for specifying the "down spread" percentage. A second data entry area comprises a data entry field 518c and a pulldown menu 518d for specifying the modulation frequency. The data entry field 518c provides a data entry area, and the frequency units can be selected from the choices provided in the pulldown menu.

FIG. 5C shows a screenshot, illustrating how a user can specify the parameters for various clock signal outputs generated by the PLL. The figure illustrates a screenshot for setting the C0 clock signal. This is indicated by the clock selection graphic, identifying the various clock signals that can be set. Here, the icon 522a corresponding to the clock signal C0 is shown highlighted in an appropriate fashion to indicate which clock signal is being set.

A data input area 510 allows a user to specify various analog parameters for the specified clock signal. The user enters her desired settings in data entry fields 512a–512e. Actual settings are displayed in data display fields 514a–514e. In one implementation, the actual settings can be updated in real-time fashion as soon as the user enters a new setting.

It can be appreciated that additional analog parameters which specify other analog properties of the PLL can be set via the user interface functional unit 404 by providing appropriate data entry screens as exemplified by the screens shown in FIGS. 5A–5C. Additional parameters include lock time (ms), overshoot and undershoot frequencies (%), duty cycle, attenuation factor, input jitter tolerance, jitter transfer, and added jitter. As noted above, the user can enter these parameters directly in an extended HDL language (VHDL, Verilog®, AHDL).

A typical design of a PLL on the Stratix™ device is expressed in a Verilog® HDL specification. A fragment of the HDL specification showing a sample of netlist entries for the design follows:

```
wire locked = sub_wire3;
wire [5:0] sub_wire5 = {sub_wire6, sub_wire6, sub_wire6, sub_wire4, sub_wire4};
wire sub_wire7 = inclk0;
wire [1:0] sub_wire8 = {sub_wire6, sub_wire7};
wire [3:0] sub_wire9 = {sub_wire6, sub_wire6, sub_wire6, sub_wire6};
altpll  altpll_component (
                .clkena (sub_wire5),
                .inclk (sub_wire8),
                .pllena (pllena),
                .extclkena (sub_wire9),
                .areset (areset),
                .clk (sub_wire0),
                .locked (sub_wire3));
defparam
        altpll_component.clk1_divide_by = 1,
        altpll_component.bandwidth = 1000000,
        altpll_component.bandwidth_type = "CUSTOM",
        altpll_component.clk1_phase_shift = "0",
        altpll_component.clk0_duty_cycle = 50,
        altpll_component.lpm_type = "altpll",
        altpll_component.clk0_multiply_by = 1,
```

The highlighted portion of the HDL fragment is an extension of the HDL definition in accordance with the invention. The HDL statement:

altpll_component.bandwidth=1000000 is an extension of the HDL language according to the present invention which specifies the bandwidth of the PLL (e.g., 1 MHz). This analog parameter is called out in terms of a property of the analog circuit itself, namely, its bandwidth, rather than in terms of the programmable analog elements that would implement the circuit. This obviates the user having to specify implementation specific detail in order to obtain a PLL circuit having a bandwidth of 1 MHz. The statement:

altpll_component.bandwidth_type="CUSTOM"

is an HDL extension which simply informs the synthesis compiler functional unit 410 that a specific value is being supplied for the bandwidth.

Consider the following modified HDL fragment:

```
wire locked = sub_wire3;
wire [5:0] sub_wire5 = {sub_wire6, sub_wire6, sub_wire6, sub_wire4, sub_wire4};
wire sub_wire7 = inclk0;
wire [1:0] sub_wire8 = {sub_wire6, sub_wire7};
wire [3:0] sub_wire9 = {sub_wire6, sub_wire6, sub_wire6, sub_wire6};
```

-continued

```
altpll  altpll_component (
                .clkena (sub_wire5),
                .inclk (sub_wire8),
                .pllena (pllena),
                .extclkena (sub_wire9),
                .areset (areset),
                .clk (sub_wire0),
                .locked (sub_wire3));
defparam
        altpll_component.clk1_divide_by = 1,
        altpll_component.bandwidth_type = "AUTO",
        altpll_component.down_spread = "0.500",
        altpll_component.spread_frequency = 3333333,
        altpll_component.clk1_phase_shift = "0",
        altpll_component.clk0_duty_cycle = 50,
        altpll_component.lpm_type = "altpll",
        altpll_component.clk0_multiply_by = 1,
```

The highlighted portion illustrates further extensions to the HDL definition. Here, the modified segment specifies the analog parameters for a specific spread spectrum characteristic of the PLL. The HDL statement:

altpll_component.bandwidth_type="AUTO"

indicates that the bandwidth parameter has not been specified by the user and can be determined by the compiler instead, in order to optimize the other properties specified by the user; e.g., spread spectrum or phase offset.

The statement:

altpll_component.down_spread="0.500"

specifies the user requested down spread percentage. This extension of the HDL definition allows the user to specify the down spread parameter explicitly, rather than requiring the user to identify the hardware parameters of the various programmable elements and to specify the values (hardware properties) to implement is aspect of the PLL.

The statement:

altpll_component.spread_frequency=3333333 is another extension of the HDL definition in accordance with the invention that specifies the spread frequency, another analog parameter which specifies a property of the PLL.

It can be appreciated from the foregoing that the definition of any HDL language can be easily extended to include other primitives for specifying the properties of other types of analog circuits.

Figure 6:
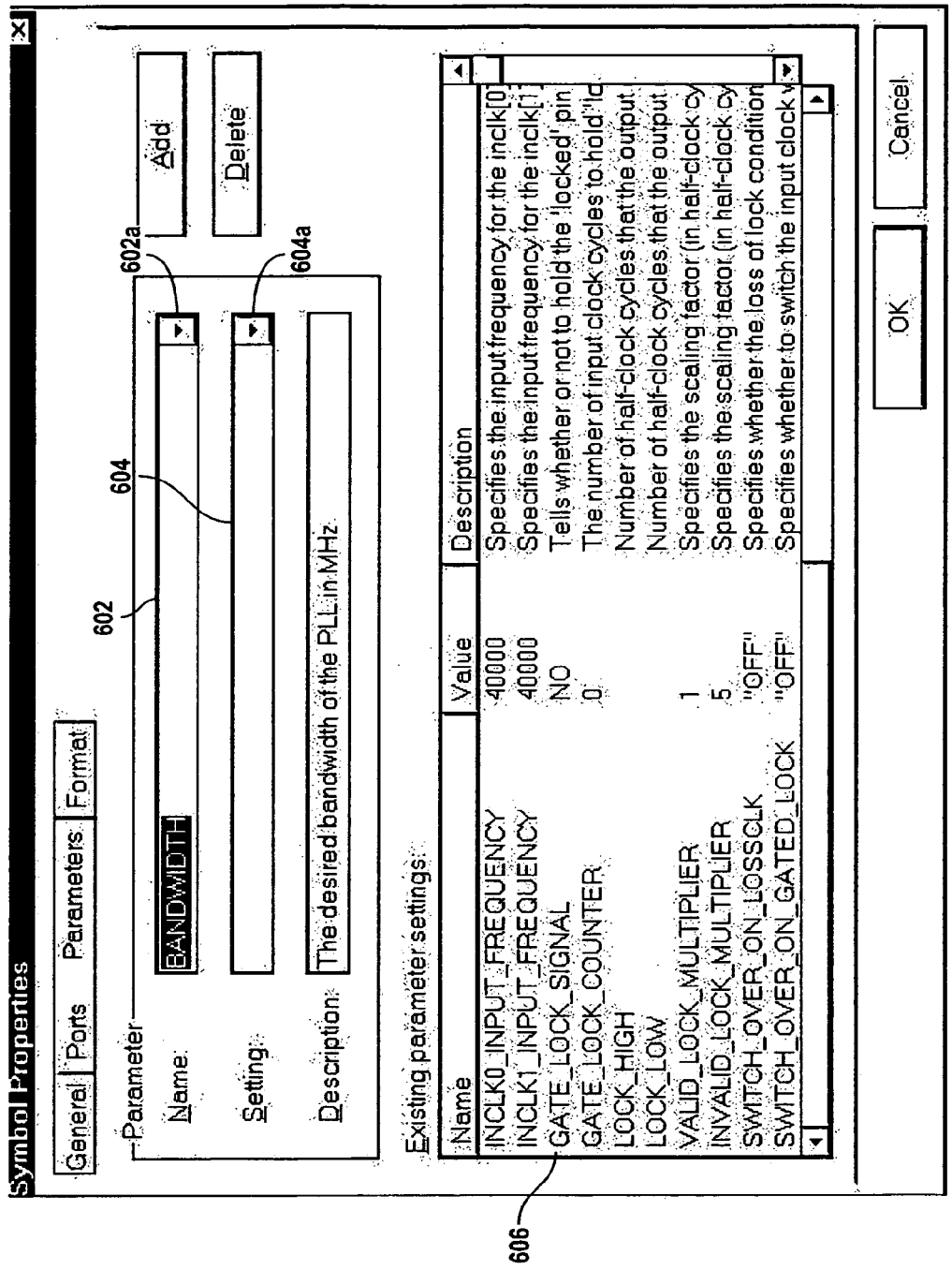
FIG. 6 illustrates an example of an alternative data entry GUI.

FIG. 6 shows an alternative data entry method that can allow a user to modify an existing design, or even to create a design. The graphic shown in FIG. 6 provides a data entry field 602 which allows a user to enter an analog parameter, or alternatively to select the parameter from a dropdown menu activated by clicking on the dropdown menu selector graphic 602a. The parameters provided in this data field include the hardware parameters for the programmable analog elements and analog parameters for specifying analog circuit properties, such as bandwidth. A second data entry field 604 allows the user to enter a specific setting for the selected parameter. In some cases, predefined values may be available. In some cases, the parameter can only be set to certain predefined values. In such cases, a dropdown menu selector graphic 604a can be provided to activate a dropdown menu showing the selectable settings. A window 606 can be provided which lists all of the parameters in the particular programmable device (e.g., Stratix™ device) that can be set. This window, which can be scrollable, offers the user another access path to the parameters. Thus, the user can simply double-click in the window on the parameter of interest. The window can provide information such as the current setting of each parameter.

Recall from FIG. 4 that the computational functional unit 408 computes all of the above hardware properties (values, settings) for programming the programmable analog elements. In the case of a PLL, the programmable analog element values for a given programmable device can include a charge pump current setting, a high frequency loop capacitor setting, a loop resistor setting, and a VCO gain setting. A user who is not familiar with the theory of PLL operation would be hard-pressed to identify the hardware parameters needed to implement a PLL (or any analog circuit) and to specify the hardware properties of those hardware parameters to achieve a desired behavior in the PLL. Worse yet, different devices are likely to provide different programmable analog elements with different settable hardware parameters. Thus, even if one is familiar with the implementation specifics of one programmable device, that knowledge may not carry over to other devices. By extending the HDL specification language in accordance with the invention to provide for language constructs which allow one to specify the analog properties of an analog circuit, intimate familiarity with the specific programmable device can be obviated. Providing an appropriate interface further facilitates the users ability to specify an analog circuit.

As noted above, the computational functional unit 408 performs the transformation of the various analog parameters which characterize the properties of an analog circuit to generate the hardware properties of the programmable analog elements. In accordance with an embodiment of this aspect of the invention, a transformation technique includes iteratively solving for circuit equations which describe the analog circuit in terms of the parameters of the programmable analog elements that are available for implementing the analog circuit. The solution is determined incrementally, resulting in a set of one or more hardware properties used to program the programmable analog elements to implement the analog circuit.

Figure 7:
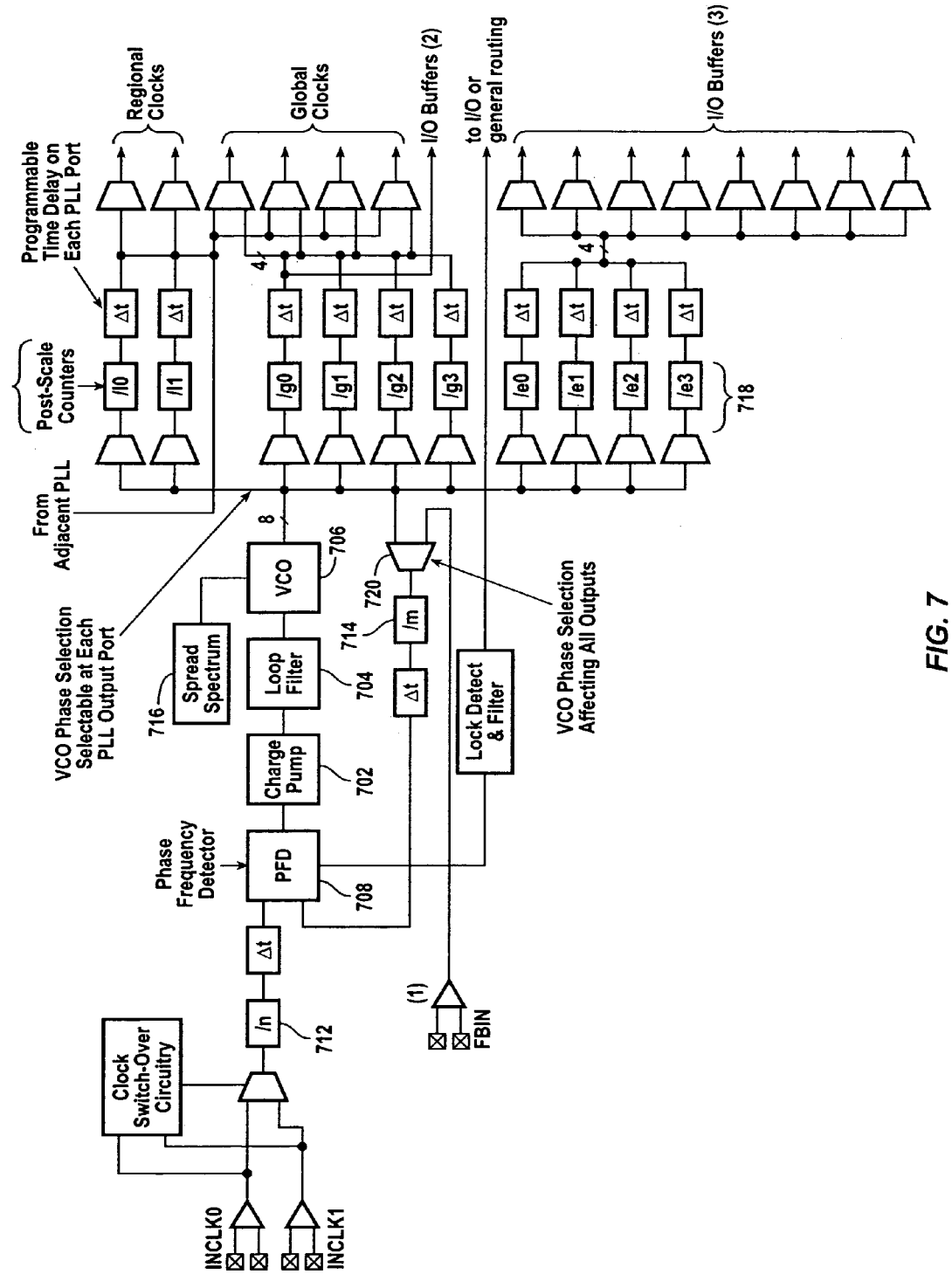
FIG. 7 shows a block diagram of an example of a programmable analog device.

An example for illustrating this aspect of the invention is a PLL that is implemented on the Stratix™ programmable device as shown in FIG. 7. The programmable analog elements include a charge pump circuit 702, a loop filter 704, and a voltage controlled oscillator (VCO) circuit 706. The charge pump circuit can be programmed in terms of its charge pump current setting. The loop filter has a high frequency loop capacitor that can be programmed. The loop filter also has a settable loop resistance value. The VCO gain setting is programmable.

The computations to produce the specific hardware properties can be performed by iterating over all possible values for the charge pump current, capacitors and resistor, as well as values for the various counters. The result will be a set of hardware properties that meet the hardware stability criteria which provide the necessary user-specified properties, and which optimize those default settings that were not user-specified. If more than one combination is legal, then the compiler can be configured to choose the best one to optimize a performance property; e.g., the jitter peaking. Since there can be millions of possible combinations of values, an optimization is usually needed.

Optimization methods are well understood techniques. The specific analytical treatment depends largely on the particular PLL implementation. The following optimization algorithm is illustrative of the general principles involved, as applied to the Stratix® programmable device shown in FIG. 7.

Inputs: vco and pfd min and max period and vco center period
discrete set of values for I, R, and C
These inputs are hardware limits which come from the design of the chip. For example, the design simulations produce a range of vco and pfd frequency at which the chip can work. The discrete set of values for I, R, and C are the values which can be programmed on chip. The algorithm will select one value each for I, R, and C among the possible values. For example, for Stratix, I can be 2 uA, 3 uA, 5 uA, . . . etc. to 200 uA - about 20 values; C can be 5, 10, 15, 20 pF.

User Inputs: input period for the clock of the PLL pp.m__input_period
Desired multiplication and division ratio for each output (i = 0, 9)
This is input from the modified HDL specification.
For example: altpll__component.inclk0__input__frequency = 10000,
altpll__component.clk0__multiply__by = 1,
altpll__component.clk0__divide__by = 1, The following are the division and multiplication values as specified by the user. They are copied from altpll_component.clk0_multiply_by and altpll_component.clk0_divide_by.
  pp.m_taps[i].m_mult
  pp.m_taps[i].m_div Following are the user-specified properties of the PLL circuit:
  Desired input period for the clock of the PLL pp.m_input_period
  Desired multiplication and division ratios pp.m_taps[i].m_mult, pp.m_taps[i].m_div
  Desired phase for each output pp.m_taps[i].m_phase
  Desired duty cycle for each output pp.m_taps[i].m_duty_cycle
  Desired spread spectrum pp.m_down_spread.
  Desired modulation frequency pp.m_ss_period.
  Desired bandwidth type pp.m_bandwidth_type - HIGH, MEDIUM, LOW, CUSTOM
  Desired bandwidth value pp.m_bandwidth (If CUSTOM, then this is relevant)
  Output:
Fully configured PLL.
M, N (in case of spread spectrum: M2, N2, SS)
R, $C_h$, I—resistor, capacitor, current settings for the loop parameters.

The algorithm computes the full configuration of the PLL, including the programmable hardware elements R, $C_h$, I which can satisfy stability criteria such as:
  Fzero=1/(2*Pi*R*C); Pi=3.14
  Fpole=1/(2*Pi*R*Ch);
  Bandwidth=I*R*Kvco/(M*2*Pi); and
  Fzero<Bandwidth<Fpole.

Figure 7A:
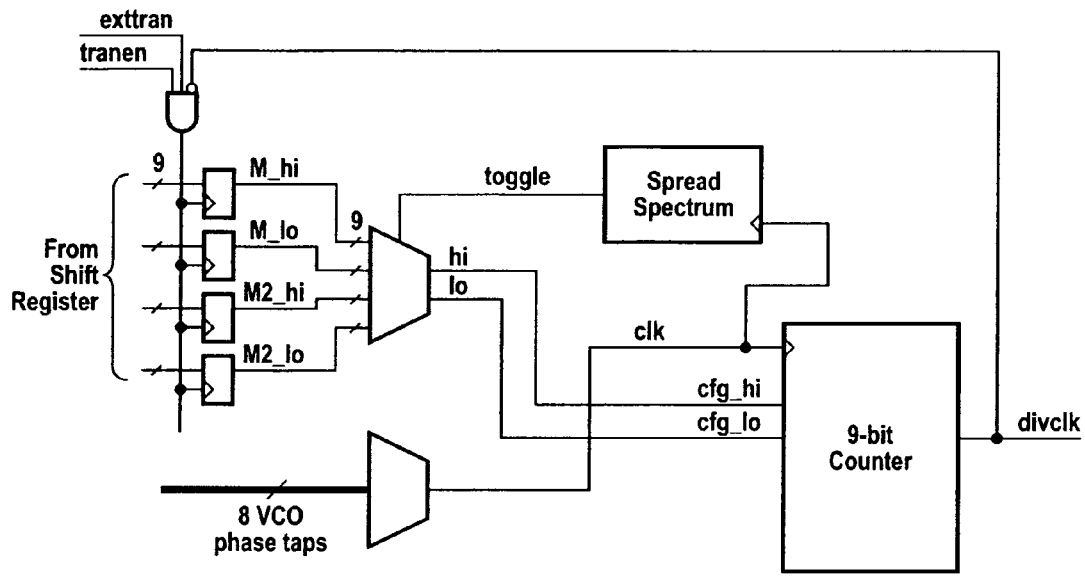
FIG. 7A shows additional detail for the spread spectrum element shown in FIG. 7.

Referring to FIG. 7, M is the counter setting for the loop counter and N is the setting for the frequency pre-divider 712. In the case of a Spread Spectrum setting, the settings M2 and N2 are a second set of values for counters used in the spread spectrum module 716 (shown in detail in FIG. 7A). SS is the spread-spectrum counter. These parameters are determined below.

Figure 7B:
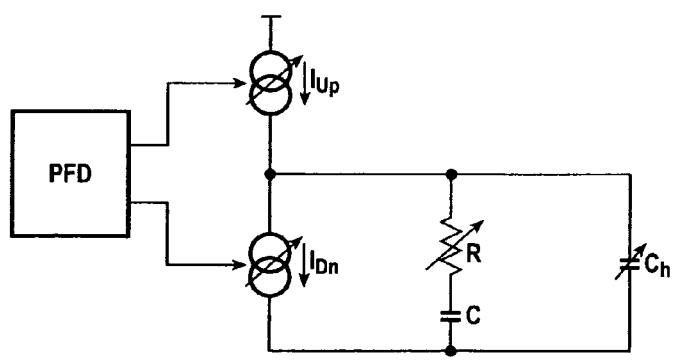
FIG. 7B shows additional detail for the loop filter of FIG. 7.

The R, C parameters specify the RC constant of the loop filter 704. The I parameter is in the charge pump current in the charge pump 702. FIG. 7B shows additional detail of the loop filter, showing the programmable elements that can be set. These parameters are determined below.

pll.m_taps[i].m_high, pll.m_taps[i].m_low

The "pll.m_taps" values are the high and low values, respectively, of the post-scale counters 718.

pll.m_taps[i].m_initial,
pll.m_taps[i].m_ph

The .m_ph refers to which VCO tap it feeds from, selector 720.

It can be appreciated by those of skill in the relevant arts that other cost criteria can be used to target other hardware parameters in a similar manner. The algorithm above merely illustrates this and other aspects of the invention. Other cost criteria can be readily formulated and plugged into the algorithm to achieve optimizations of other targets depending on the particulars of a specific PLL implementation. For

```
{ Begin M Loop
   if(m > min_m * MAX_M_MULT) exit loop, e.g. next m value
   ir = static_cast<int>(required_bandwidth_value * m/m_kvco);
   ir_ok = true;
   if (ir > ir_max || ir < ir_min)
   {
      ir_ok = false;
   }
   if(spread_required) m must be > 1/down_spread otherwise exit loop (e.g. next M value)
   /* now try all N values)
   for (n = 1; n <= max_n; n++)
   { Begin N Loop
      double vco_period = pp.m_input_period * static_cast<double> (n)/m;
         double pfd_period = pp.m_input_period * static_cast<double> (n);
      if ( not (
         m_vco_min_period > vco_period && vco_period <= m_vco_max_period &&
         m_pfd_min_period <= pfd_period && pfd_period <= m_pfd_max_period)
         )
      { exit N loop - next n value }
      // assume all taps same max count
      const int max_tap_count = this->m_taps[i].m_max_count;
      // output counter G = (m * div)/(n * mult), since mult/div = M/(n*g)
      int a = m * pp.m_taps[i].m_div;
      int b = n * pp.m_taps[i].m_mult;
      pll.m_taps[i].m_count = (double)a/b + 0.5; -- to find closest if not exact
      const int& count = pll.m_taps[i].m_count;
      // probably not needed.
      pll.m_taps[i].m_bypass = (1 == pll.m_taps[i].m_count);
      pll.m_taps[i].m_count = count;
      /* this sets a tentative duty cycle at 50% */
      pll.m_taps[i].m_high = pll.m_taps[i].m_count/2;
      pll.m_taps[i].m_low = pll.m_taps[i].m_count - pll.m_taps[i].m_high;
      pll.m_taps[i].m_even = pll.m_taps[i].m_count % 2 == 0;
      pll.m_taps[i].m_max_count = this->m_taps[i].m_max_count;
      // give it cost for not being exact, if achievable tap_cost will be 0.
      //int tap_cost = a % b;
      // there is a variation to cost differently, based on closest output frequency, e.g.
      tap_cost = (double)(a)/b - (double)(div)/mult
      cost += tap_cost;
/* set the best phase, e.g. determine initial values of counters and phase tabs - irrelevant for duty cycle or
   phase_cost = . . .
*/
      cost += phase_cost.
      // cost variation
      cost += fabs(vco_period - vco_center)
   Keep track of the one with best cost and save it for later use.
      if (cost < best_cost)
      {
         cost = best_cost
         best_pll = pll;
      }
   } End loop N
} End loop M
```

An aspect of the invention includes computing cost criteria which control the optimization path for computing some of the hardware properties. For example, in the bandwidth computation, the determination of the loop filter resistor R can be influenced by a cost criterion to limit its allowable maximum value. A motivation for doing this could be to prevent jitter peaking This is shown in the algorithm above where cost+=0.01*(r_tent/r_min), where 0.01 is a weight factor This cost increases if r_tent, which is the tentative R, increases above the minimum possible R.

example, it may be desirable to optimize M to be close to the startup frequency to minimize startup/lock time. This is done in the following code:

Cost+=fabs(vco_period−vco_center).

Other possible optimizations due to simulations is to minimize N. More generally, such optimizations can be readily adapted for hardware parameters to instantiate other analog circuits.

Figure 8:
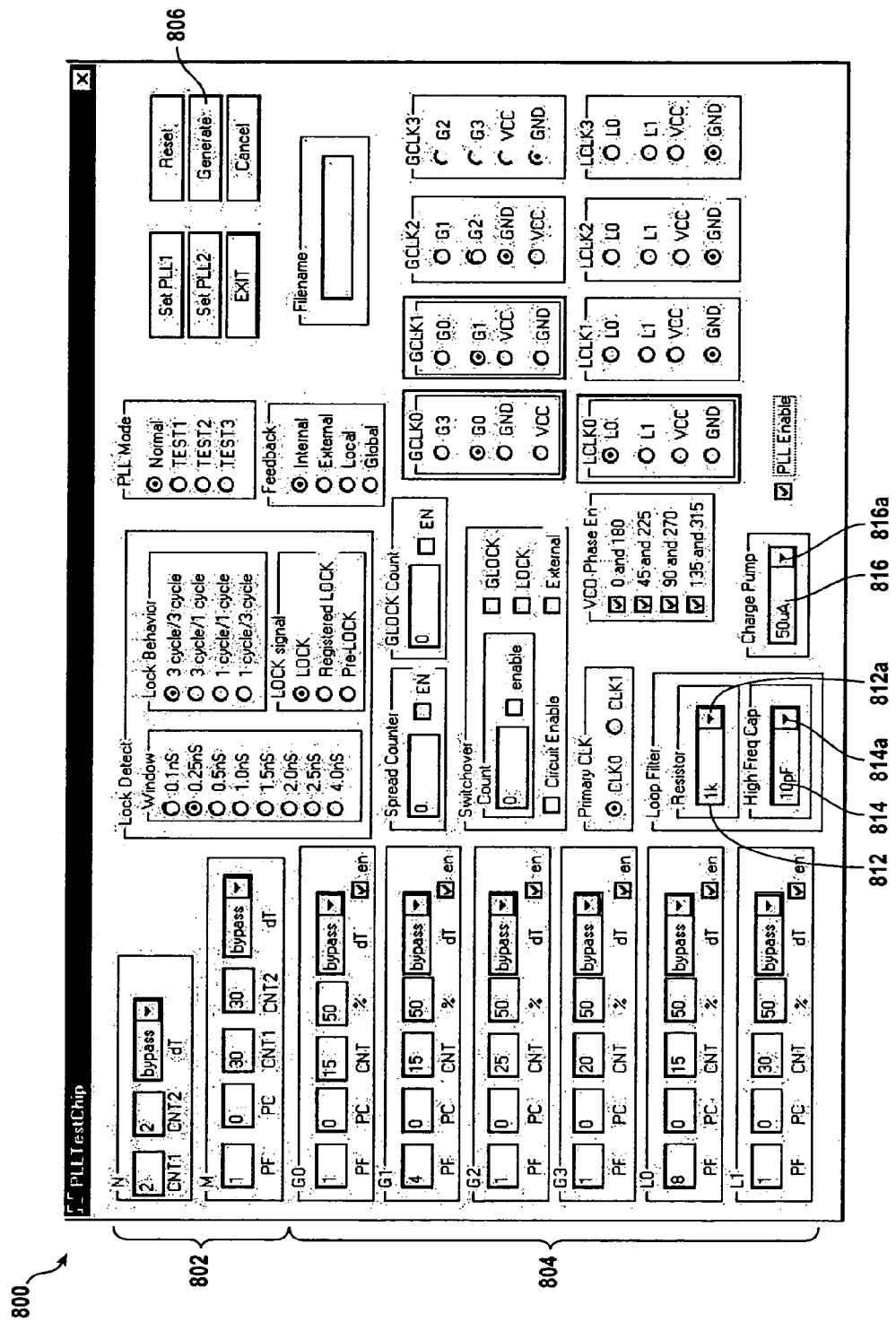
FIG. 8 shows an interface to facilitate "what if" inquiries.

FIG. 8 shows an implementation of a GUI in accordance with another aspect of the present invention which provides for exercising so-called "what-if" design scenarios, and to facilitate verification. The "what if" interface exemplar 800 shown in the figure allows a user to specify the analog parameters for the circuit shown in FIG. 7. This interface can be used in the following scenarios:

The user enters observable analog properties in a suitable fashion, for example, via the GUI shown in FIG. 5A. Suppose the user enters a bandwidth parameter of 1000 Hz for an analog circuit. The computation engine 408 then computes values for the programmable analog elements (e.g., based on the algorithm outlined above) to implement an instance of the analog circuit having a bandwidth of 1000 Hz. The computed hardware properties can then be displayed or otherwise represented in a suitable form, such as in the GUI exemplar shown in FIG. 8.

Next, the user can edit the values of one or more of the hardware parameters via the GUI of FIG. 8. For example, suppose one of the programmable analog elements is a loop resistor, and that the computed loop resistance is 1KΩ. The user can modify this value and perform a "reverse computation" to produce predicted observable analog properties (in this case bandwidth) based on the modified loop resistance. The user can be presented with the display shown in FIG. 5A, for example, to see the effects of her modifications. In an embodiment of this aspect of the invention, the computation engine 408 can perform a "reverse computation" by applying conventional circuit modeling algorithms or other similarly known analytical tools for modeling circuits to compute analog parameters based on the user-modified values. This aspect of the invention allows the designer to hand tweak or otherwise fine-tune her design.

One aspect of the invention is to find the closest possible values for the desired analog properties. Given that the programmable analog elements can only be set to one of a finite set of discrete values, not all analog property values can be achieved. This algorithm finds the closest possible "discrete" values; e.g., 10 pf, 15 pf, 20 pf, etc., as compared to 10.134 pf or 11.33 pf. The what-if scenarios are very important in this case, so the user can fine tune the achieved values by adjusting values of other programmable analog elements in an attempt to compensate for the fact that the programmable analog elements can only take on discrete values.

Alternatively, the user may choose not to edit any of the computed hardware properties. Instead, the user can feed the computed values back to the computation engine and simply perform a "reverse computation" on the computed values to produce predicted analog properties. The predicted values can then be displayed, for example, via GUIs such as those shown in FIGS. 5A–5C. As an observation, the predicted analog properties should closely match the initial user-specified analog parameters. However, the "forward" computation whereby hardware properties are computed based on analog properties may be based on analog models that are different from the models used by the "reverse" computation whereby analog properties are computed from hardware properties. This aspect of the invention, therefore, allows a designer to prove (and possibly fine-tune) her design, at least on a theoretical level, before committing it to hardware.

FIG. 8 shows a particular implementation of this aspect of the invention. An input field 802 for receiving from a user counter modulo values for the counters 712 and 714. Similar input fields 804 are provided for receiving from a user parameters for setting the post-scale counters 718. By the use of these input fields, "experiments" can be performed on the digital aspects of the design.

In accordance with this aspect of the invention, similar "what if" experimentation can be performed on the hardware parameters for which were computed based on the user-specified analog parameters of an analog circuit contained in the design. Data fields for the hardware parameters can be provided to display a representation of their computed hardware properties and to receive new values from a user. Thus, for example, the loop resistor can be adjusted via a data field 812. This data field can initially display the value computed by the computation engine 408. The data field is writable and can accept a user-entered value. Alternatively, a drop down menu can be provided to provide the user with a choice of alternative resistance values. For example, all possible values that can be programmed on the hardware for the programmable analog element (e.g., resistor) can be provided. A drop down menu indicator 812a can be provided to activate this menu.

A high frequency capacitor component of the loop filter can be adjusted. An data field 814 can display the value computed by the computation engine 408. This data field can accept a user-supplied capacitance value. Alternatively, a drop down menu can be activated via an activation button 814a. The drop down menu can provide a set of capacitance values.

A computed charge pump value can be displayed in the data field 816. As with the other data fields, this data field can accept a user-provided datum. A drop down menu, activated by the button 816a, can provide all of the possible values for the programmable analog charge pump current.

A GENERATE button 806 can be provided to initiate a round of computations when the desired hardware properties for a "what if" experiment have been entered. The computation engine then calculate the observable properties, e.g. bandwidth, lock-time, etc. The observable properties will then reflect any changes to the digital parameters that the user might have inputted in the 802 and 804 data fields and any changes made to the hardware parameters that the user might have specified in the 812–816 data fields. For example, the designer can be taken back to one of the parameter input screens (FIGS. 5A–5C, for example) to review the results of her "experiment." In one scenario, the designer can then modify one or more analog properties and perform a "forward" computation to compute new values. She can return to the "what if" interface 800, and repeat the whole exercise.

The foregoing detailed description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This detailed description will enable others skilled in the art to best utilize and practice the invention in various embodiments and with various modifications as are suited to the particular use contemplated. It is intended that the scope of the invention be defined by the following claims.

What is claimed is:

1. A method for programming a programmable logic device (PLD), the PLD having one or more programmable analog elements, the method comprising:

receiving first information representative of one or more logic functions;

receiving second information representative of at least one analog circuit, the second information comprising a high level description of the at least one analog circuit including parameter information representative of an analog property of the analog circuit; and producing a bitstream based on the first information and the second information including at least performing a step of compiling the high level description in the second information to generate a portion of the bitstream, the bitstream suitable for programming the PLD to implement the one or more logic functions and to implement the analog circuit having the analog property specified by the parameter information.

2. The method of claim 1 wherein the second information is an HDL (hardware description language) representation of the analog circuit, the HDL representation including one or more HDL statements representative of the parameter information.

3. The method of claim 1 wherein the step of producing a bitstream includes determining, based on the parameter information, at least one hardware property of a first programmable analog element used to implement the analog circuit.

4. The method of claim 3 wherein the first programmable analog element can be set to one of a finite number of discrete values and the step of determining at least one hardware property includes selecting a value from among the finite number of discrete values.

5. The method of claim 1 wherein the step of producing a bitstream includes iteratively solving circuit equations to produce values for one or more programmable analog elements to implement the analog circuit, the circuit equations representative of the analog parameter of analog circuit.

6. The method of claim 1 wherein the first information comprises one or more netlist entries representative of the one or more logic functions and the second information comprises one or more netlist entries representative of the parameter information of the analog circuit.

7. The method of claim 1 wherein the step of receiving the first and second information includes presenting a graphical user interface (GUI) to a user and receiving user input from the user via the GUI.

8. The method of claim 7 further including determining values for the programmable analog elements used to implement the analog circuit and displaying the values via the GUI.

9. The method of claim 1 wherein the parameter information of the analog circuit comprises one or more of a bandwidth quantity, a spread spectrum quantity, a duty cycle quantity, a lock time value, frequency overshoot, and an attenuation factor.

10. The method of claim 1 wherein the PLD is a field programmable gate array.

11. The method of claim 1 wherein the at least one analog circuit is a phase locked loop.

12. A method for programming an electronic device having programmable elements including programmable logic elements and programmable analog elements, the method comprising:

presenting a graphical user interface (GUI) for receiving information representative of a high level description of an analog circuit and for receiving information representing at least one analog property associated with an analog parameter of the analog circuit;

solving circuit equations in an iterative manner to produce computed values for one or more programmable analog elements to implement the analog circuit, including producing intermediate values in a first iteration and using the intermediate values in a subsequent iteration, the circuit equations defining the analog parameter of the analog circuit; and producing a bitstream suitable for programming some of the programmable analog elements to implement the analog circuit having the at least one analog property specified by the analog parameter, including at least performing a step of compiling the high level description of the analog circuit, the bitstream including information representative of one or programming values for the programmable analog elements, the one or more programming values based on the computed values.

13. The method of claim 12 wherein the step of solving circuit equations includes, for each programmable analog element, receiving one or more initial values from among a finite set of discrete values, the one or more initial values being used as first intermediate values.

14. The method of claim 13 further comprising producing a new analog property based on the one or more initial values and displaying a representation of the new analog property, whereby a verification can be performed by comparing the at least one analog property with the new analog property.

15. The method of claim 12 further comprising producing a hardware description language (HDL) representation of the analog circuit, the HDL representation including one or more primitives representing the analog parameter, wherein the bitstream includes information representing the values determined from the HDL representation of the analog circuit.

16. The method of claim 12 further including determining a computed analog property based on the final values, whereby the step of producing can be performed based on a comparison of the computed analog property against the at least one analog property.

17. The method of claim 12 further comprising displaying a representation of the final values via the GUI, whereby a user can decide whether or not to proceed with the step of producing the bitstream.

18. The method of claim 12 further comprising:

obtaining an initial hardware description language (HDL) representation of the analog circuit, the initial HDL representation including one or more primitives representative of the analog parameter, the at least one analog property based on the one or more primitives;

displaying the computed values;

modifying one or more of the computed values to produce modified values for the programmable analog elements; and producing a final HDL representation, the final HDL representation based on the modified values, wherein the bitstream is based on the final HDL representation.

19. The method of claim 18 further comprising producing a new analog parameter based on the modified values and displaying a representation of the new analog parameter.

20. The method of claim 12 wherein the step of solving circuit equations includes, for each programmable analog element, receiving one or more initial values from among a finite set of discrete values, the one or more initial values being used as first intermediate values, the method further comprising determining a computed analog parameter based on the computed values, whereby the step of producing can be performed based on a comparison of the computed analog property against the at least one analog property.

21. The method of claim 12 further comprising:
determining initial values for the programmable analog elements based on the at least one analog property and displaying a representation of the initial values via the GUI;
receiving one or more new analog parameters representing one or more analog properties of the analog circuit; and
determining second values for the programmable analog elements based on the new analog parameters,
wherein the bitstream includes information representing the second values.

22. The method of claim 21 further including producing a hardware description language (HDL) representation of the analog circuit, the HDL representation comprising one or more primitives representing the one or more modified parameters, wherein the bitstream is produced based on the HDL representation.

23. The method of claim 12 wherein the one or more programming values are the same as the computed values.

24. A computer program product comprising a computer readable medium having recorded thereon computer program code configured to facilitate programming an electronic device comprising programmable elements, including programmable logic elements and programmable analog elements, the computer program code comprising instructions to perform the method steps of:
receiving a representation of a design, the design comprising digital circuitry and a high level description of analog circuitry, the representation including information representative of one or more analog parameters which specify one or more properties of the analog circuitry;
determining values based on the one or more analog parameters, the values being used to program the programmable analog elements; and
producing a bitstream based on the representation including at least performing a step of compiling the high level description, the bitstream suitable for programming the programmable elements to implement the logic circuitry and analog circuitry of the design, the analog circuitry having the one or more properties specified by the analog parameters.

25. The method of claim 24 wherein the step of determining values includes, for each programmable analog element, selecting a value from among a finite set of discrete values.

26. The computer program product of claim 24 wherein the computer program code further comprises instructions to perform the additional step of producing a hardware description language (HDL) representation of a design, the HDL representation including one or more statements representing the one or more analog parameters.

27. The computer program product of claim 24 wherein the representation is an electronic document containing a plurality of HDL statements, including statements representative of the one or more analog parameters.

28. The computer program product of claim 24 wherein the computer program code further comprises instructions to perform additional steps during the step of determining values, the additional steps comprising:
(i) determining first values based on the one or more analog parameters;
(ii) displaying a representation f the first values;
(iii) computing new analog parameters based on the first values; and
(iv) displaying a representation of the new analog parameters, thereby providing for a verification of the first values.

29. The computer program product of claim 24 wherein the computer program code further comprises instructions to perform additional steps during the step of determining values, the additional steps comprising:
(i) determining first values based on the one or more analog parameters;
(ii) displaying a representation of the first values;
(iii) receiving one or more new values;
(iv) computing new analog parameters based on the new values; and
(v) displaying a representation of the new analog parameters.

30. The computer program product of claim 24 wherein the instructions to perform the step of determining comprise instructions to solve circuit equations in an iterative manner, including producing intermediate values in an iteration and using the intermediate values in a subsequent iteration, the circuit equations defining the one or more analog parameters of the analog circuitry.

31. The computer program product of claim 24 wherein the programmable logic elements and programmable analog design elements are a portion of an electronic device.

32. The computer program product of claim 24 wherein the computer program code further comprises instructions to perform a method step of saving the bitstream to a file.

33. The computer program product of claim 24 wherein the computer program code further comprises instructions to perform a method step of outputting the bitstream to a programming device configured to program the programmable logic elements and the programmable analog design elements.

34. A system to facilitate programming an electronic device having programmable logic elements and programmable analog elements comprising:
a user interface (UI) component configured to obtain first information representative of a design, the design including at least one analog circuit, the first information representing at least one or more parameters of the analog circuit;
a computation component operative with the UI component to produce second information representative of programmable element parameters relating to the design, including values for the programmable analog elements corresponding to the analog circuit; and
a synthesis component operative with the computation component to compile a hardware description language (HDL) specification to produce a bitstream suitable for programming the programmable logic and analog elements,
wherein the UI component is further configured to provide the second information to a user so that the user can verify the design based on the second information,
wherein the UI component is further configured to produce a first HDL specification representative of the design, the first HDL specification including HDL statements representative of the one or more parameters of the analog circuit,
whereby the synthesis component produces a first bitstream suitable for programming the programmable logic elements and the programmable analog elements to implement the design by compiling the first HDL specification.

35. The system of claim 34 wherein the UI component is one of a command line interface comprising a set of user commands, a graphical user interface, and a machine to machine interface.

36. The system of claim 34 wherein the analog circuit is a phase-locked loop (PLL) and the one or more parameters comprise a combination of one or more of a bandwidth, a spread spectrum specifier, and a duty cycle.

37. A system for programming an electronic device having programmable logic elements and programmable analog elements comprising:

means for receiving first information representative of a design, the design including a high level description of at least one analog circuit, the first information including information representative of one or more analog parameters of the analog circuit;

means for producing second information based on the first information, the second information representative of one or more values for the programmable analog elements; and means for compiling the high level description of the at least one analog circuit and the second information to produce third information suitable for programming the programmable logic elements and the programmable analog elements to implement the at least one analog circuit having properties specified by the one or more analog parameters.

38. The system of claim 37 wherein the second information comprises an HDL representation of the analog circuit, the HDL representation including one or more statements representative of the one or more analog parameters.

39. The system of claim 37 further comprising:

means for presenting a representation of the second information to a user;

means for producing fourth information based on the second information, the fourth information representative of predicted analog parameters; and means for presenting a representation of the fourth information, whereby the second information can be verified by comparing the predicted analog parameters with the one or more analog parameters represented by the first information.

40. The system of claim 37 further comprising:

means for presenting a representation of the second information to a user;

means for receiving one or more modifications of the second information to produce modified second information;

means for producing fourth information based on the modified second information, the fourth information representative of one or more modified analog parameters; and means for presenting a representation of the fourth information.

* * * * *